US011798637B2

(12) United States Patent
Cariello

(10) Patent No.: US 11,798,637 B2
(45) Date of Patent: Oct. 24, 2023

(54) CURRENT BUDGET ADAPTION

(71) Applicant: Micron Technology, Inc., Boise, ID (US)

(72) Inventor: Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 239 days.

(21) Appl. No.: 17/461,558

(22) Filed: Aug. 30, 2021

(65) Prior Publication Data

US 2023/0067955 A1   Mar. 2, 2023

(51) Int. Cl.
*G11C 7/00* (2006.01)
*G11C 16/34* (2006.01)
*G11C 16/26* (2006.01)
*G11C 16/30* (2006.01)

(52) U.S. Cl.
CPC ......... *G11C 16/3404* (2013.01); *G11C 16/26* (2013.01); *G11C 16/30* (2013.01)

(58) Field of Classification Search
CPC ....... G11C 5/147; G11C 5/14; G11C 11/4074; G11C 16/30; G11C 5/143
USPC .................................................. 365/226, 227
See application file for complete search history.

(56) References Cited

U.S. PATENT DOCUMENTS 9,496,042 B1 * 11/2016 Abiko .................... G11C 16/26
2002/0167849 A1 * 11/2002 Ohbayashi ........... G11C 29/832
365/189.09

* cited by examiner

*Primary Examiner* — Son T Dinh
(74) *Attorney, Agent, or Firm* — Holland & Hart LLP

(57) ABSTRACT

Methods, systems, and devices for current budget adaption are described. A controller may be coupled with a set of memory devices. The controller may receive current consumption information from the set of memory devices and update a current consumption budget for the set of memory devices based on the current consumption information.

23 Claims, 9 Drawing Sheets

CURRENT BUDGET ADAPTION

FIELD OF TECHNOLOGY

The following relates generally to one or more systems for memory and more specifically to current budget adaption.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
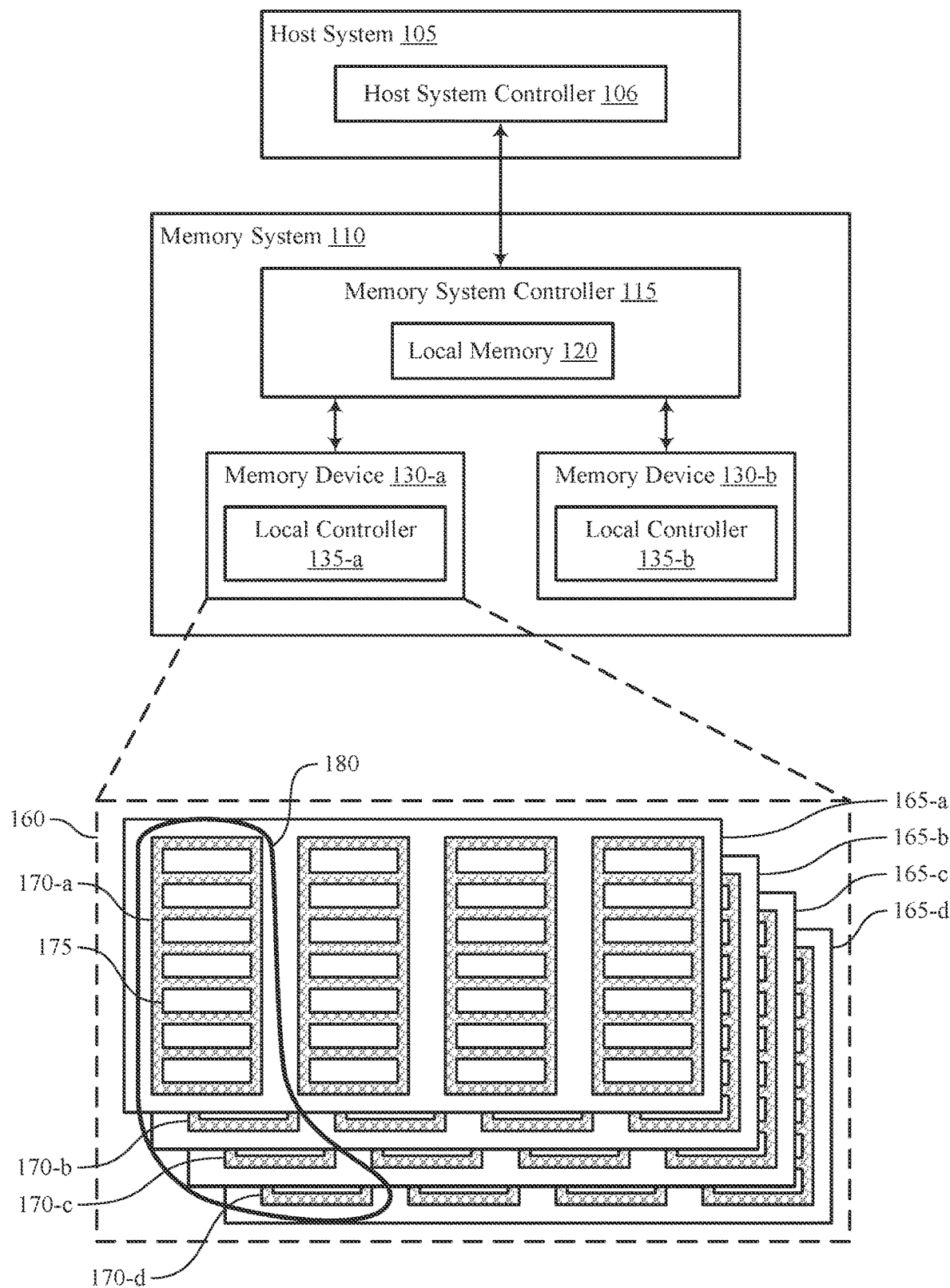
FIG. 1 illustrates an example of a system that supports current budget adaption in accordance with examples as disclosed herein.

In some systems, there may be an upper limit on the amount of current that a group of memory devices is permitted to consume at any given instant, which may be referred to as the current consumption budget or peak current budget. However, the current consumption budget that is set for the group of memory devices may be inappropriate for the system (e.g., due to manufacturing variability in systems and platforms). If the current consumption budget is set too high, full use of the current consumption budget by the group of memory devices may negatively affect the voltage of a power supply line that provides power to the group of memory devices. For example, full use of the current consumption budget may pull the voltage of the power supply line (referred to as the supply voltage) down to a level that is insufficient for various operations, which may impair system performance, among other disadvantages. According to the techniques described herein, a controller may improve system performance by adaptively updating the current consumption budget for a group of memory devices.

For cost and efficiency reasons, a controller may not have hardware to measure the current consumed by the memory controller and the memory devices in the system. To keep peak current consumption under control, both the controller and the memory devices may forecast the expected consumption before allocating power to different circuitry and operation. According to the techniques described here, a controller may correlate this current consumption information with the voltage level on the power supply line, which may be monitored to protect the system from conditions that are outside of the range supported by the system.

In a first example of the techniques described herein, the controller may cause the group of memory devices to save (e.g., store) current consumption information upon detecting a threshold decrease in the supply voltage. If the current consumption information indicates that the group of memory devices was using (or was close to using) the full current consumption budget around the time of the supply voltage decrease, the controller may set a new (e.g., lower) current consumption budget for the group of memory devices.

In a second example of the techniques described herein, the controller may be connected to the group of memory devices in a manner that allows the controller to receive the current consumption messages that are exchanged between the memory devices for power management. Based on the current consumption information conveyed by the messages, the controller may correlate current consumption by the group of memory devices with decreases in the voltage supply and extrapolate the amount of current consumption that will cause an unacceptable decrease in the supply voltage. The controller may then set a new current consumption budget for the group of memory devices based on (e.g., according to) the extrapolation. Although described separately, aspects of the first example and the second example may be combined.

Figure 2:
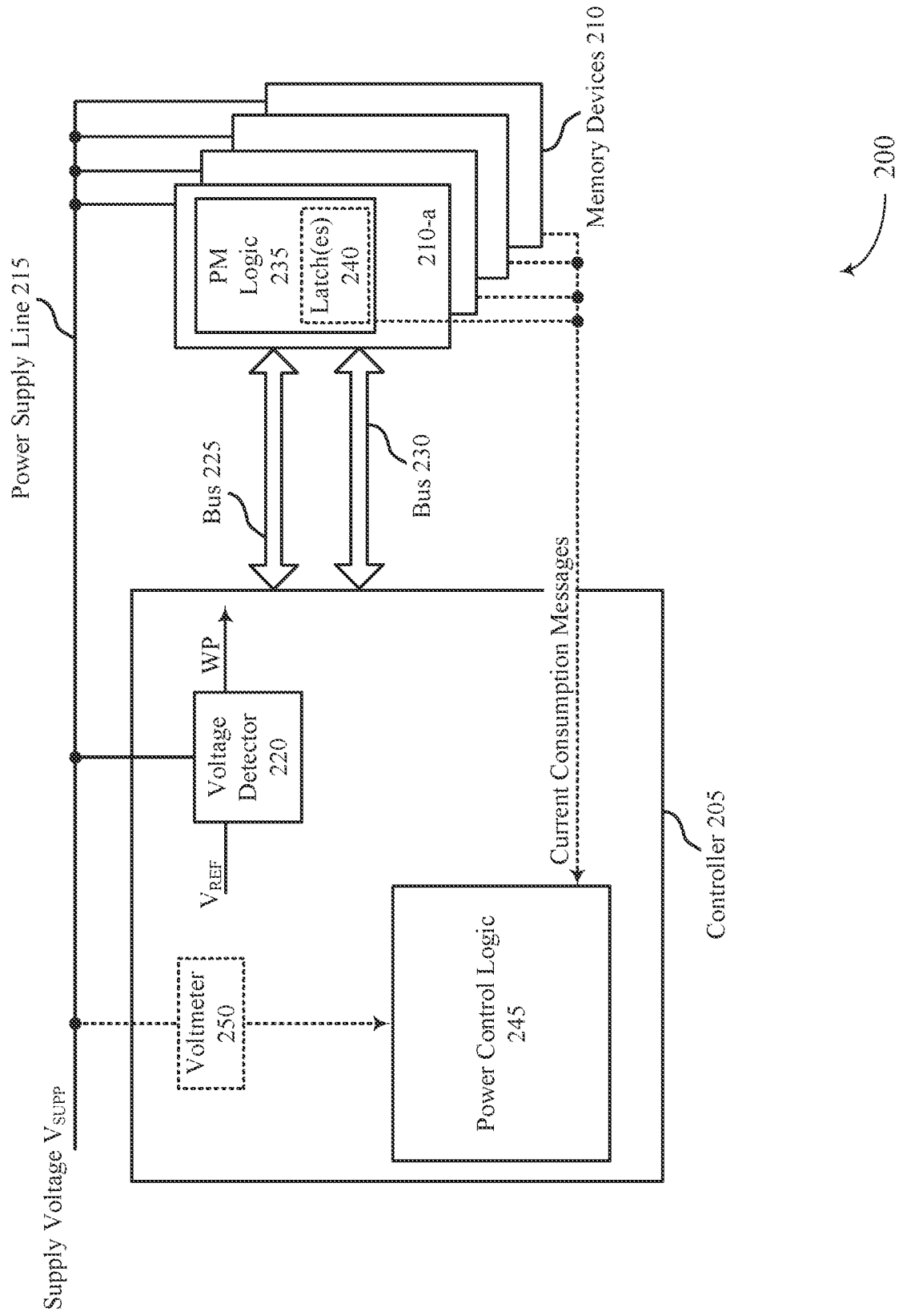
FIG. 2 illustrates an example of a system that supports current budget adaption in accordance with examples as disclosed herein.

Features of the disclosure are initially described in the context of systems, devices, and circuits with reference to FIGS. 1 and 2. Features of the disclosure are described in the context of process flows with reference to FIGS. 3-4. These and other features of the disclosure are further illustrated by and described in the context of apparatus diagrams and flowcharts that relate to current budget adaption with reference to FIGS. 5-9.

FIG. 1 illustrates an example of a system 100 that supports current budget adaption in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EE-PROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165 *c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support current budget adaption. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some examples, a controller (e.g., the host system controller 106 or the memory system controller 115) may set a current consumption budget for the memory devices 130. Alternatively, the current consumption budget may be pre-configured at the memory devices 130. The current consumption budget may be the peak amount of current the memory devices 130 are collectively permitted to consume at any given time. The current consumption budget may impact the performance of the system 100. For example, if the current consumption budget is set too low, the memory devices 130 may perform operations serially rather than in parallel (e.g., to stay within the current consumption budget), which may reduce efficiency. If the current consumption budget is set too high, the current consumption by the memory devices 130 may draw the voltage supply down to an impermissible or inoperable level, which may impair operations, result in operational interruptions, or both.

The memory devices 130 may comply with the current consumption budget by exchanging current consumption messages that convey information (which may be referred to as current consumption information) about the current consumption of the devices. For example, the current consumption messages may indicate the quantity of tokens a memory device 130 expects to use for a given period of time. A token, which may also be referred to as a current token, may represent or be associated with an amount of current, such as x milliamps (mA), which may be predefined. So, a memory device 130 that expects to consume mA during a period of time may indicate that expected consumption to other memory devices 130 by sending a current consumption message that indicates two tokens (assuming a token quantization of 20 mA). The current consumption message may also indicate the period of time. By monitoring the current consumption of other memory devices 130, each memory device 130 may tailor its own individual current consumption to ensure that the collective (e.g., total) current consumption by the memory devices 130 stays within the current consumption budget. The phrase "current consumption" may refer to consumption of an electrical current, as opposed to referring to the relative timing of consumption.

In some cases, the current consumption budget for the memory devices 130 may be inappropriate for the system 100. For example, the current consumption budget may not account for manufacturing variability between memory devices 130 or systems 100, which may result in different power profiles between those memory devices 130 and systems 100. Additionally or alternatively, the current consumption budget may not account for quantization errors that cause the actual current consumption of a memory device 130 to exceed the predicted current consumption (which in turn may cause the memory devices 130 to inadvertently exceed the current consumption budget). As noted, if the current consumption budget for the memory device 130 is set too high, full use of the current consumption budget may draw the supply voltage below a threshold level (e.g., to an inadequate level for operation). But conservatively setting the current consumption budget may reduce the performance of the operations of the memory devices 130.

According to the techniques described herein, a controller may adaptively update the current consumption budget for the memory devices 130 to a level that is tailored to the system 100. For example, a controller (e.g., the host system controller 106 or the memory system controller 115) may receive current consumption information from the memory devices 130 and use that current consumption information as a basis for updating the current consumption budget. Thus, the initial current consumption budget may be set aggressively, then adaptively scaled back based on the power profile of the system 100, which may allow the memory devices 130 to operate at (or closer to) full capacity without disrupting the supply voltage.

FIG. 2 illustrates an example of a system 200 that supports current budget adaption in accordance with examples as disclosed herein. The system 200 may be an example of a system 100 as described with reference to FIG. 1 or aspects thereof. The system 200 may include a controller 205, which may be an example of a host system controller 106 or a memory system controller 115 as described with reference to FIG. 1. The system 200 may also include memory devices 210, including memory device 210-a, which may be examples of the memory devices 130 described with reference to FIG. 1.

The controller 205 may include power control logic 245, which may be configured to use current consumption information from the memory devices 210 as a basis for adaptively setting the current consumption budget for the memory devices 210. For example, the power control logic 245 may be configured to use the current consumption information to determine if the current consumption budget is inappropriate (e.g., too high), and if so, to update the current consumption budget to an appropriate (e.g., lower) level.

The memory devices 210 may each include respective power management (PM) logic 235, which may also be referred to as peak power management (PPM) logic, programmable peak power management (PPPM) logic, or other suitable terminology. The power management logic 235 for a memory device 210 may be configured to manage the power consumption of that memory device 210 based on various factors (e.g., based on operations of the memory device 210, based on current consumption information from other memory devices 210, based on the current consumption budget). For example, the power management logic 235 may be configured to determine an amount of current consumption expectations of the memory device 210, process current consumption messages from other memory devices 210, and issue current consumption messages to the other memory devices 210. Current consumption messages may also be referred to as power management messages or other suitable terminology.

As noted, the current consumption messages issued by the power management logic 235 may indicate the current consumption (e.g., in quantities of tokens) of a memory device 210 for a given period of time so that the power consumption of other memory devices 210 can be adjusted (e.g., to ensure the memory devices 210 stay within the current consumption budget). Thus, the power management logic 235 for each memory device 210 may be coupled with the power management logic 235 of other memory devices 210 via one or more pins or buses. In some examples, the power management logic 235 may include or be coupled with one or more latch(es) 240 that are configured to store current consumption information. In such examples, the memory device 210 may transfer the current consumption information from the latch(es) 240 to one or more registers (e.g., mode registers) that are indirectly accessible by the controller 205. The one or more latches 240 may also be referred to as latching components, latching circuitry, or other suitable terminology.

The system 200 may include a power supply line 215, which may also be referred to as a power supply rail or other suitable terminology. The power supply line 215 may be coupled with a power source and may provide power (e.g., voltage and current) to the controller 205 and the memory devices 210.

Various conditions may cause the voltage of the power supply line 215 (referred to as supply voltage $V_{SUPP}$) to fluctuate. For example, the supply voltage $V_{SUPP}$ may decrease if the power source (e.g., a battery) is drained, if an external (e.g., peripheral) device consumes (e.g., draws) current, or if the memory devices 210 consume current, among other possibilities. Decreases in the supply voltage $V_{SUPP}$ may be proportional to the amount of current consumed by the memory devices 210 (e.g., higher current consumption may correspond to larger decreases). If the supply voltage $V_{SUPP}$ decreases below a threshold level for reliable operations (referred to as the minimum voltage level ($V_{MIN}$)), the controller 205, the memory device 210, or both may suspend, halt, or abort some or all operations until the supply voltage $V_{SUPP}$ rises above the minimum voltage level $V_{MIN}$.

In some examples, the current consumption budget for the memory devices 210 may be set aggressively (e.g., relatively high), to the extent that full (or nearly full) use of the current consumption budget causes the supply voltage $V_{SUPP}$ to be pulled below the minimum voltage level $V_{MIN}$. In such a scenario, the controller 205 may prevent the memory devices 210 from pulling (or repeatedly pulling) the supply voltage $V_{SUPP}$ below the minimum voltage level $V_{MIN}$ (and consequently interrupting or stalling system operation) by using current consumption information from the memory devices 210 to dynamically update the current consumption budget.

In a first example, the controller 205 may use the voltage detector 220 to detect if the supply voltage $V_{SUPP}$ decreases below the minimum voltage level $V_{MIN}$. For example, the voltage detector 220 may compare the supply voltage $V_{SUPP}$ to a reference voltage (denoted $V_{REF}$) that may be equal to the minimum voltage level $V_{MIN}$. Upon detecting that the supply voltage $V_{SUPP}$ has transitioned below the minimum voltage level $V_{MIN}$ (or is less than the minimum voltage level $V_{MIN}$), the voltage detector 220 may issue a command, such as asserting the write protect (WP) signal (also referred to as a write protect command) that instructs the memory devices 210 to suspend one or more operations. The write protect command may also instruct, or prompt, the memory device 210 to save (e.g., in the latch(es) 240) the individual current consumption information for that memory device 210. The individual current consumption information for a memory device 210 may indicate the actual or expected current consumption of that memory device 210 (e.g., the actual or expected current consumption around the time the voltage supply $V_{SUPP}$ transitioned below the minimum voltage level $V_{MIN}$). The write protect command may be communicated to the memory devices 210 using the dedicated write protect pin or over a bus, such as the bus 225.

After falling below the minimum threshold voltage $V_{MIN}$, the voltage supply $V_{SUPP}$ may increase until the voltage supply $V_{SUPP}$ is once again above the minimum threshold voltage $V_{MIN}$. Upon detecting (e.g., via the voltage detector 220) that the voltage supply $V_{SUPP}$ has increased above the minimum voltage level $V_{MIN}$ (or is greater than the minimum voltage level $V_{MIN}$), the controller 205 may instruct the memory devices 210 to 1) resume the one or more suspended operations, re-initiate one or more aborted operations, or both, and 2) send the individual current consumption information that was saved in the latch(es) 240. The individual current consumption information may be communicated from the memory devices 210 to the controller 205 over a bus, such as the bus 230. The controller 205 may then (e.g., via the power control logic 245) use the individual current consumption information from the memory devices to determine whether the collective current consumption of the memory devices 210 was responsible for the decrease in the voltage supply $V_{SUPP}$. For example, the power control logic 245 may add or combine the individual current consumption indicated for each memory device 210 and determine whether the sum (which represents the collective current consumption by the memory devices 210) is equal to (or within a range) of the current consumption budget.

If the collective current consumption by the memory devices 210 is equal to (or within the range) of the current consumption budget, the controller 205 may determine (e.g., via the power control logic 245) that the current consumption budget is too high. That is, the controller 205 may determine that the current consumption budget was insufficient to prevent the collective current consumption of the memory devices 210 from pulling the supply voltage $V_{SUPP}$ below the minimum threshold voltage $V_{MIN}$ Put another way, the controller 205 may determine that the collective current consumption of the memory device 210, which is limited by the current consumption budget, was at least partially, if not primarily or wholly, responsible for the supply voltage $V_{SUPP}$ decreasing below the minimum threshold voltage $V_{MIN}$. Accordingly, the controller 205 may update (e.g., decrease) the current consumption budget and indicate the updated current consumption budget to the memory devices 210.

The first example may allow the current consumption budget to be set aggressively, then subsequently tailored to the characteristics of the system 200, which may also include a host system (e.g., a host system 105) and a memory system (e.g., a memory system 110). Tailoring the current consumption budget to the characteristics of the system 200 may allow components of the system 200, such as the memory devices 210, to 1) operate closer to full capacity (relative to other techniques that statically set the current consumption budget too conservatively), and 2) reduce supply voltage interruptions (relative to techniques that statically set the current consumption budget too aggressively). The first example may also prevent the controller 205 from inappropriately or indiscriminately lowering the current consumption budget if a condition (e.g., low battery) other than the current consumption of the memory devices 210 causes the voltage supply $V_{SUPP}$ to drop below the minimum voltage $V_{MIN}$.

In a second example, the controller 205 may include a voltmeter 250 that is configured to sample (e.g., determine the level of) the supply voltage $V_{SUPP}$. Additionally, the controller 205 may be coupled with the memory devices via one or more conductive lines. For instance, the power control logic 245 may be coupled with the power management logic 235 of some or all of the memory devices 210. Thus, the power control logic 245 may receive power management messages from the power management logic 235. Based on (e.g., using) the power management messages, the power control logic 245 may determine the collective current consumption of the memory devices 210 at various points in time. For example, the power control logic 245 may determine the collective current consumption of the memory devices 210 by adding the respective individual current consumption of each memory device 210. In some examples, the voltmeter 250 may be an example of a voltage detector. In some examples, the voltage detector 220 may include a voltmeter.

The power control logic 245 may use the collective current consumption of the memory devices 210 to determine a correlation or relationship between current consumption of the memory devices and decreases of the supply voltage $V_{SUPP}$. For example, the power control logic 245 may (e.g., via the voltmeter 250) sample (e.g., measure) the supply voltage $V_{SUPP}$ to determine the level of the supply voltage $V_{SUPP}$ at various points in time. The power control logic 245 may determine the difference between consecutive measurements of the supply voltage $V_{SUPP}$ and plot the differences against the collective current consumption of the memory devices 210 that is coincident with (or at least partially overlaps in time with) the measurements.

Thus, the power control logic 245 may determine the correlation between collective current consumption and decreases in the supply voltage $V_{SUPP}$. Based on the correlation, the power control logic 245 may extrapolate a collective amount of current consumption that will result in the voltage supply $V_{SUPP}$ decreasing below the minimum threshold level $V_{MIN}$. If the collective amount of current consumption is equal to or within a threshold range (e.g., within 5%) of the current consumption budget, the controller 205 may update (e.g., decrease) the current consumption budget and indicate the updated current consumption budget to the memory devices 210.

The second example may allow the controller 205 to adaptively update the current consumption budget without waiting for the voltage $V_{SUPP}$ to drop below the minimum voltage level $V_{MIN}$. Like the first example, the second example may prevent the controller 205 from inappropriately or indiscriminately lowering the current consumption budget if a condition (e.g., low battery) other than the current consumption of the memory devices 210 causes the voltage supply $V_{SUPP}$ to drop below the minimum voltage $W_{MIN}$.

In some examples of the second example, the voltmeter 250 and the voltage detector 220 may be combined into a single circuit that provides the functionality of the voltmeter 250 and the voltage detector 220. Although described, separately, aspects of the first example and the second example may be combined. Additionally or alternatively, the system 200 may switch between the first example and the second example.

Figure 3:
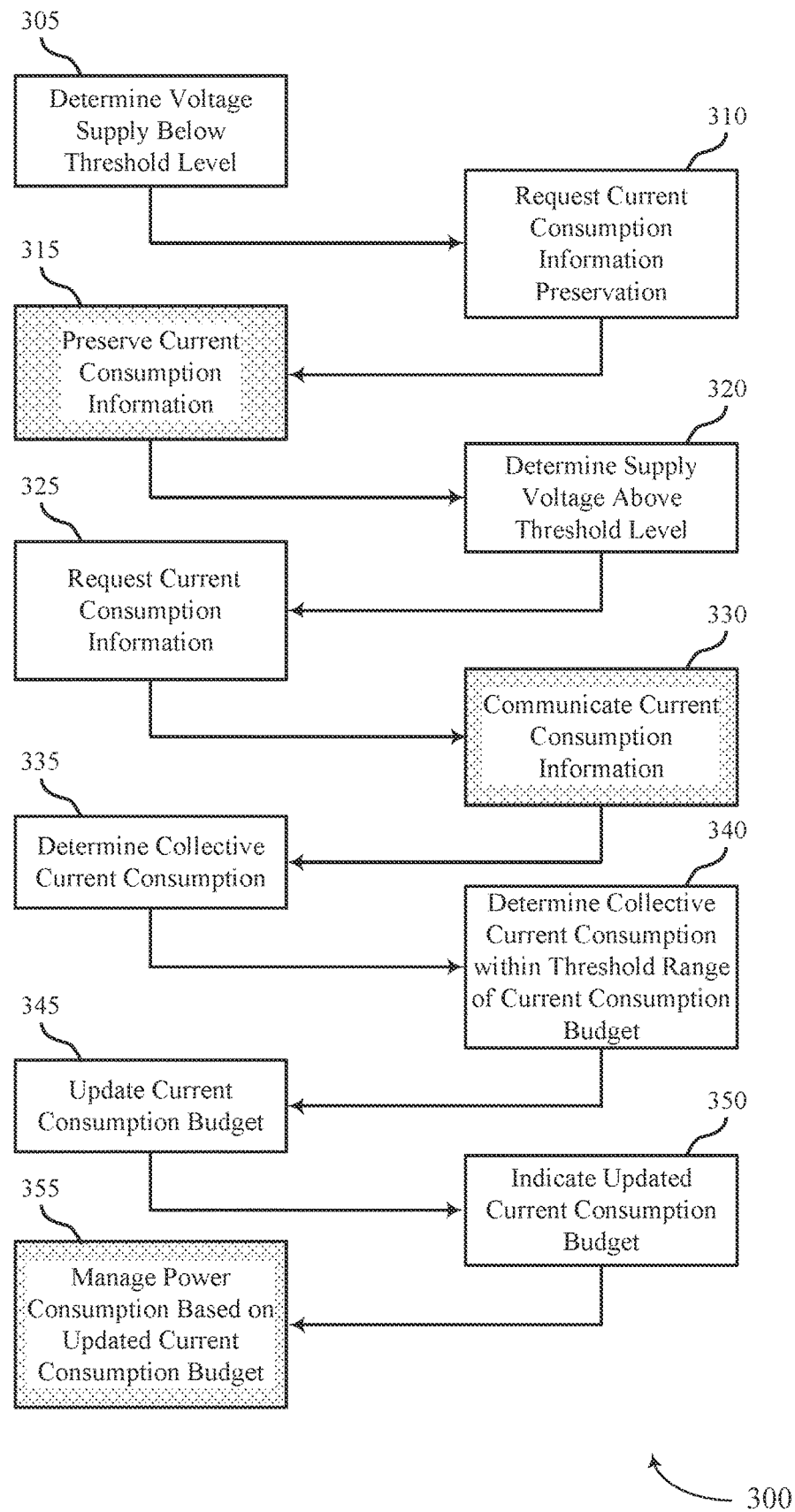
FIG. 3 illustrates an example of a process flow that supports current budget adaption in accordance with examples as disclosed herein.

FIG. 3 illustrates an example of a process flow 300 that supports current budget adaption in accordance with examples as disclosed herein. The process flow 300 may be implemented by a system, such as the system 200 as described with reference to FIG. 2. For example, the system 200 may implement aspects of the process flow 300 to perform the first example for adaptively updating the current consumption budget. Operations that may be performed by a controller, such as the controller 205, are illustrated by white boxes and operations that may be performed by one or more memory devices, such as a memory device 210, are illustrated by shaded boxes. However, other distributions of the operations between the devices are contemplated and within the scope of the present disclosure.

Aspects of the process flow 300 may be implemented by one or more controllers, among other components. Additionally or alternatively, aspects of the process flow 300 may be implemented as instructions stored in memory (e.g., firmware stored in a memory coupled with the controller 205 or the memory device 210). For example, the instructions, if executed by a controller (e.g., the controller 205 or a controller coupled with the memory device 210), may cause the controller to perform the operations of the process flow 300.

At 305, it may be determined that the supply voltage $V_{SUPP}$ is (or has decreased) below a threshold level. For example, the controller 205 may (e.g., via the voltage detector 220) determine that the supply voltage $V_{SUPP}$ is (or has decreased) below the threshold minimum voltage $V_{MIN}$.

At 310, a request for the preservation of current consumption information may be made. For example, the controller 205 may issue one or more commands (e.g., write protect commands) that indicate a recipient memory device 210 is to preserve (e.g., save, store) recent current consumption information for that individual memory device (which may be referred to as individual current consumption information). For instance, the command(s) may trigger, instruct, or otherwise prompt the recipient memory device 210 to store recent (e.g., the latest) individual current consumption information for that memory device 210. In some examples, the command(s) may also indicate that a recipient memory device 210 is to suspend or abort one or more operations (which may otherwise be compromised by the low supply voltage).

At 315, individual current consumption information may be preserved. For example, some or all of the memory devices 210 may store respective individual current consumption information. The individual current consumption information may indicate or represent an individual amount of current actually consumed, or expected to be consumed, by the memory device 210 within a threshold amount of time of the supply voltage $V_{SUPP}$ decreasing below the minimum threshold voltage $V_{MIN}$. In some examples, the individual current consumption information may be stored in one or more latch(es) 240 before being transferred to one or more mode registers of the memory device(s) 210.

At 320, it may be determined that the voltage supply $V_{SUPP}$ is above the threshold level. For example, the controller 205 may (e.g., via the voltage detector 220) determine that the voltage supply $V_{SUPP}$ is above the minimum threshold voltage $V_{MIN}$. At 325, a request for current consumption information may be made. For example, the controller 205 may, based on (e.g., in response to) the voltage supply $V_{SUPP}$ increasing above the minimum threshold voltage $V_{MIN}$, issue a command that indicates a recipient memory device 210 is to send the individual current consumption information for that particular memory device 210. In some examples, the command may be a mode register read command. In some examples, the controller 205 may also, based on (e.g., in response to) the voltage supply $V_{SUPP}$ increasing above the minimum threshold voltage $V_{MIN}$, indicate that a recipient memory device 210 is to resume the one or more of the suspended operations.

At 330, current consumption information may be communicated. For example, each memory device 210 may send respective individual current consumption information to the controller 205 based on (e.g., in response to) the request made at 325. In some examples, the individual current consumption information may be communicated from one or more mode registers.

At 335, the collective current consumption for the memory devices 210 may be determined. For example, the controller 205 may (e.g., via the power control logic 245) add (e.g., sum, combine) the individual current consumption of each memory device 210 to determine the collective current consumption for the memory devices 210.

At 340, it may be determined that the collective current consumption of the memory devices 210 satisfies a threshold. For example, the controller 205 may (e.g., via the power control logic 245) determine that the collective current consumption is within a threshold range (e.g., is within 5%) of the current consumption budget. As another example, the controller 205 may determine that the collective current consumption is above a threshold level (e.g., is 95% of the current consumption budget). As another example, the controller 205 may determine that the collective current consumption is equal to the current consumption budget.

At 345, the current consumption budget may be updated based on (e.g., in response to) the determination at 340. For example, the controller 205 may (e.g., via the power control logic 245) update the current consumption budget from a first value to a second value. The second value may be lower than the first value so that the current consumption budget is effectively decreased.

As noted, the controller 205 may use the current consumption information to determine whether the decrease in the voltage supply $V_{SUPP}$ is correlated with the collective current consumption. In some examples, the controller may record the correlation result and update the budget based on historical data (e.g., recorded correlation results). For example, the controller may keep track of the percentage of times that a drop in the voltage supply $V_{SUPP}$ below the minimum threshold voltage $V_{MIN}$ corresponded with a collective current consumption at or near the current consumption budget. If the percentage is higher than a threshold, the controller 205 may update the current consumption budget (e.g., because it is likely that the current consumption budget was the primary factor responsible for the decreases in the voltage supply $V_{SUPP}$). If the percentage is lower than the threshold, the controller 205 may refrain from updating the current consumption budget (e.g., because it is likely that the decreases in the voltage supply $V_{SUPP}$ were due to concomitant conditions and not the collective current consumption of the memory devices 210).

At 350, the updated current consumption budget may be indicated to the memory devices 210. For example, the controller 205 may communicate the second value for the current consumption budget to the memory devices 210. At 355, the memory devices 210 may manage power consumption based on (e.g., in accordance with) the updated current consumption budget.

Thus, the controller 205 may adaptively update the current consumption budget according to the first example. Alternative examples of the foregoing may be implemented, where some operations are performed in a different order than described, are performed in parallel, or are not performed at all. In some cases, operations may include additional features not mentioned herein, or further operations may be added. Additionally, some operations may be performed multiple times or some combinations of operations may repeat or cycle.

Figure 4:
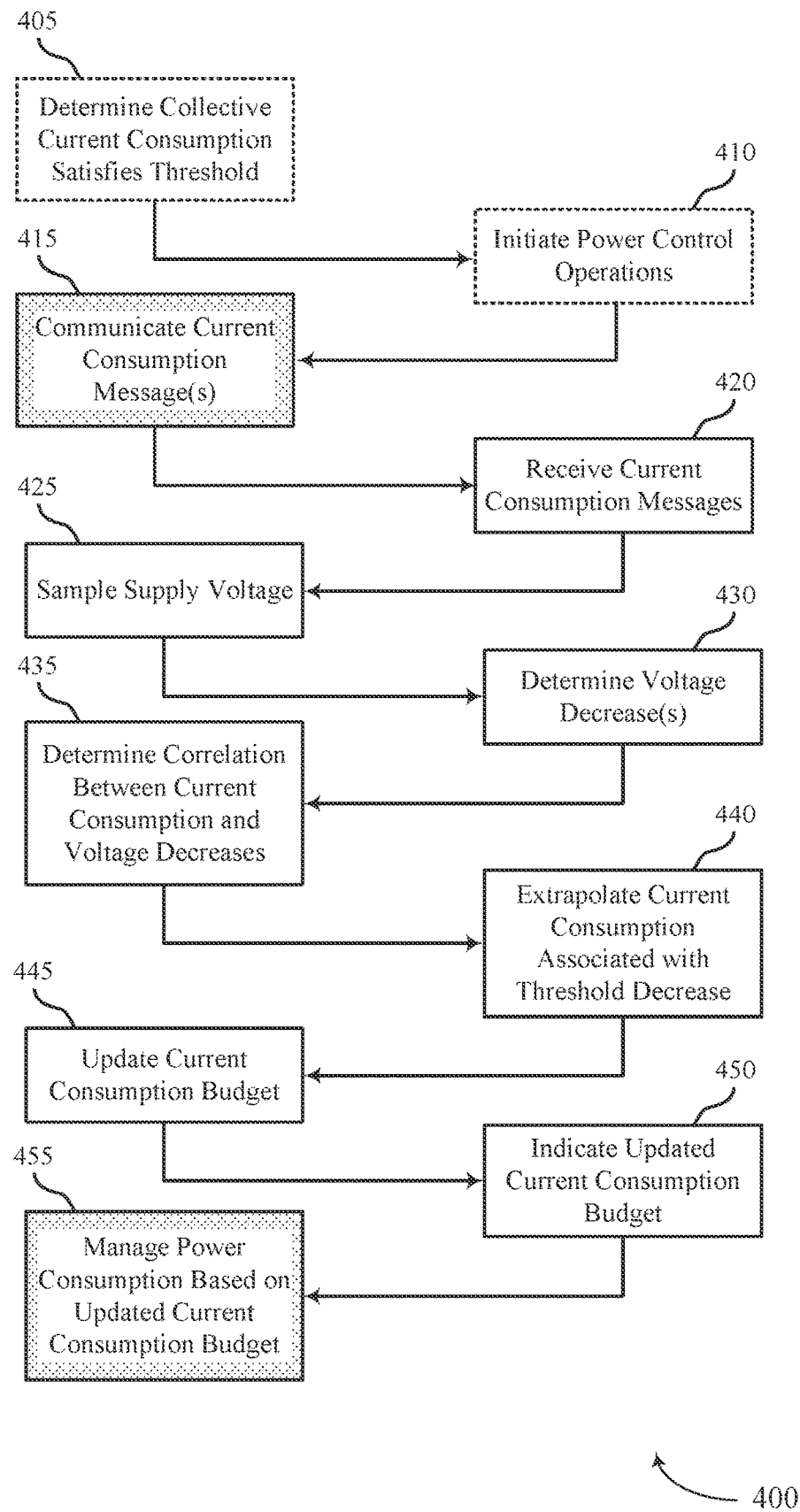
FIG. 4 illustrates an example of a process flow that supports current budget adaption in accordance with examples as disclosed herein.

FIG. 4 illustrates an example of a process flow 400 that supports current budget adaption in accordance with examples as disclosed herein. The process flow 400 may be implemented by a system, such as the system 200 as described with reference to FIG. 2. For example, the system 200 may implement aspects of the process flow 400 to perform the second example for adaptively updating the current consumption budget. Operations that may be performed by a controller, such as the controller 205, are illustrated by white boxes and operations that may be performed by one or more memory devices, such as a memory device 210, are illustrated by shaded boxes. However, other distributions of the operations between the devices are contemplated and within the scope of the present disclosure.

Aspects of the process flow 400 may be implemented by one or more controllers, among other components. Additionally or alternatively, aspects of the process flow 400 may be implemented as instructions stored in memory (e.g., firmware stored in a memory coupled with the controller 205 or the memory device 210). For example, the instructions, if executed by a controller (e.g., the controller 205 or a controller coupled with the memory device 210), may cause the controller to perform the operations of the process flow 400.

At 405, it may be determined that the collective current consumption of the memory device 210 satisfies a threshold. For example, the controller 205 may determine that the collective current consumption of the memory devices 210 satisfies a threshold that is a percentage (e.g., 70%) of the current consumption budget for the memory devices 210. In some examples, the determination at 405 may be made based on (e.g., as a function of) current consumption information conveyed by current consumption messages from one or more memory devices 210.

At 410, one or more power control operations may be initiated based on (e.g., in response to) the collective current consumption budget satisfying the threshold. For example, the controller 205 may initiate power consumption operations (e.g., supply voltage $V_{SUPP}$ sampling, correlation computing, extrapolation computing) based on the collective current consumption budget satisfying the threshold. Because meaningful (e.g., significant, detectable) decreases in the supply voltage $V_{SUPP}$ may not occur until the collective current consumption reaches the threshold, the controller 205 may conserve power by waiting to perform power control operations until after the collective current consumption satisfies the threshold.

At 415, current consumption messages may be communicated. For example, one or more of the memory devices 210 may communicate respective current consumption messages over a connection that is accessible by the controller 205. The current consumption messages may indicate individual current consumption information for the memory device(s) 210. The memory device(s) 210 may communicate the current consumption messages as part of an on-going effort to manage power between the memory devices 210 (e.g., to maintain a collective current consumption below the current consumption budget).

At 420, current consumption messages may be received. For example, the controller 205 may receive the current consumptions messages communicated by the memory device(s) 210. For instance, the controller 205 may listen in on (e.g., receive and process) the current consumption messages that are exchanged between the memory devices 210.

At 425, the supply voltage may be sampled. For example, the controller 205 may (e.g., via the voltmeter 250) sample the supply voltage $V_{SUPP}$. Sampling the supply voltage $V_{SUPP}$ may refer to measuring and determining the level (e.g., amplitude, magnitude) of the supply voltage $V_{SUPP}$. At 430, one or more decreases in the supply voltage may be determined (e.g., by sampling the supply voltage). For example, the controller 205 may (e.g., via the power control logic 245) determine one or more decreases in the supply voltage $V_{SUPP}$. The decreases may be decreases between pairs of measurements.

At 435, a correlation between collective current consumption and decreases in the voltage supply may be determined. For example, the controller 205 may determine a correlation between collective current consumption and decreases in the voltage supply $V_{SUPP}$. To do so, the controller 205 may evaluate the collective current consumption corresponding to (e.g., occurring within a threshold amount of time of) the decreases in the supply voltage $V_{SUPP}$. The collective current consumption at various points in time may be determined from current consumption messages (such as those received at 415).

At 440, a collective current consumption associated with a threshold decrease of the supply voltage $V_{SUPP}$ may be extrapolated (e.g., determined). For example, the controller 205 may extrapolate the collective current consumption based on (e.g., according to) the correlation determined at 435. The threshold decrease may be a decrease that is expected to pull the voltage supply $V_{SUPP}$ below the minimum threshold voltage $V_{MIN}$.

At 445, the current consumption budget may be updated based on (e.g., as a function of) the extrapolation at 440. For example, the controller 205 may (e.g., via the power control logic 245) update the current consumption budget from a first value to a second value. The second value may be lower than the first value so that the current consumption budget is effectively decreased.

At 450, the updated current consumption budget may be indicated to the memory devices 210. For example, the controller 205 may communicate the second value for the current consumption budget to the memory devices 210. At 455, the memory devices 210 may manage power consumption based on (e.g., in accordance with) the updated current consumption budget.

Thus, the controller 205 may adaptively update the current consumption budget according to the second example. Alternative examples of the foregoing may be implemented, where some operations are performed in a different order than described, are performed in parallel, or are not performed at all. In some cases, operations may include additional features not mentioned herein, or further operations may be added. Additionally, some operations may be performed multiple times or some combinations of operations may repeat or cycle.

Figure 5:
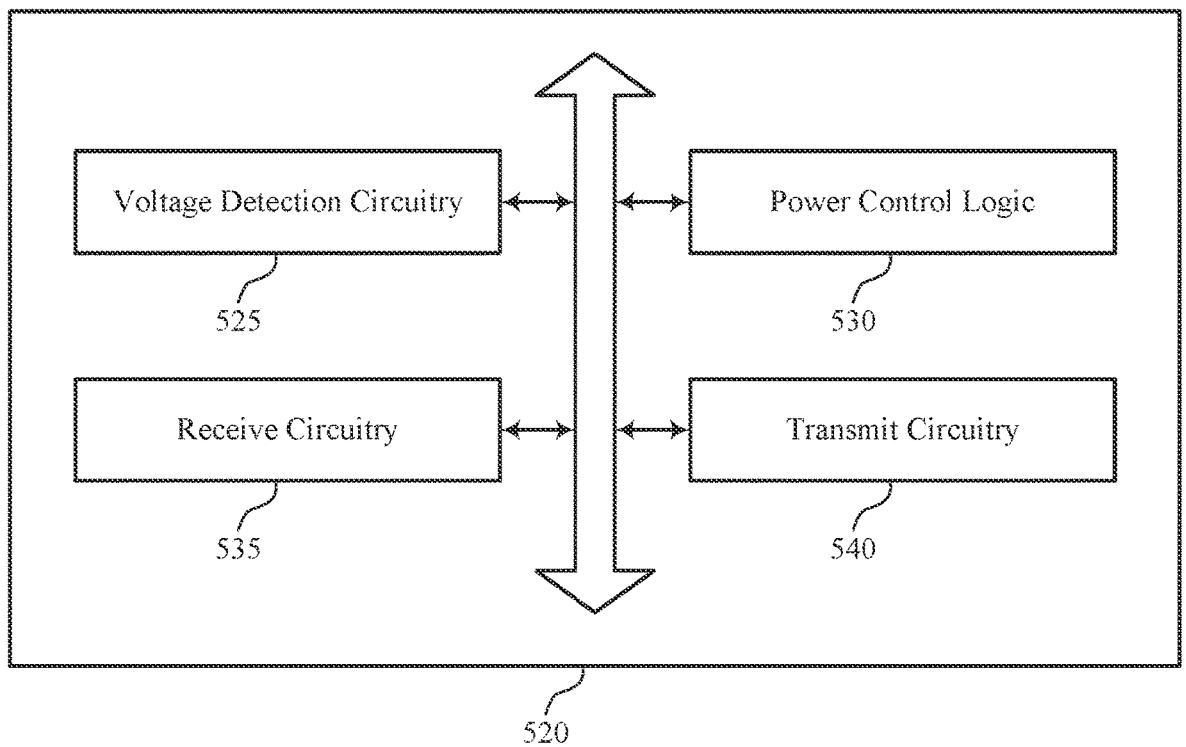
FIG. 5 shows a block diagram of a controller that supports current budget adaption in accordance with examples as disclosed herein.

FIG. 5 shows a block diagram 500 of a controller 520 that supports current budget adaption in accordance with examples as disclosed herein. The controller 520 may be an example of aspects of a controller as described with reference to FIGS. 1 through 4. The controller 520, or various components thereof, may be an example of means for performing various aspects of current budget adaption as described herein. For example, the controller 520 may include a voltage detection circuitry 525, a power control logic 530, a receive circuitry 535, a transmit circuitry 540, or any combination thereof. Each of these components may communicate, directly or indirectly, with one another (e.g., via one or more buses).

The voltage detection circuitry 525 may be configured as or otherwise support a means for determining, by a controller coupled with a power supply line and a set of memory devices, whether a voltage of the power supply line is below a threshold. The power control logic 530 may be configured as or otherwise support a means for determining, in response to determining that the voltage is below the threshold, whether a collective amount of current consumed by the set of memory devices is within a range of an upper limit for current consumption by the set of memory devices. In some examples, the power control logic 530 may be configured as or otherwise support a means for updating the upper limit for consumption of current by the set of memory devices based at least in part on determining that the collective amount of current is within the range.

In some examples, the transmit circuitry 540 may be configured as or otherwise support a means for requesting information about a respective amount of current consumed by each memory device of the set of memory devices. In some examples, the receive circuitry 535 may be configured as or otherwise support a means for receiving the information about the respective amount of current consumed by each memory device based at least in part on the request, where the collective amount of current consumed by the set of memory devices is determined based at least in part on the respective amount of current consumed by each memory device.

In some examples, the voltage detection circuitry 525 may be configured as or otherwise support a means for determining whether the voltage of the power supply line is above the threshold, where requesting the information is based at least in part on determining that the voltage of the power supply line is above the threshold.

In some examples, the transmit circuitry 540 may be configured as or otherwise support a means for requesting, based at least in part on determining that the voltage of the power supply line has decreased below the threshold, each memory device of the set of memory devices to store respective current consumption information and suspend one or more operations.

In some examples, to support updating the upper limit, the power control logic 530 may be configured as or otherwise support a means for decreasing the upper limit from a first value to a second value. In some examples, to support updating the upper limit, the transmit circuitry 540 may be configured as or otherwise support a means for indicating the second value to the set of memory devices.

In some examples, the voltage detection circuitry 525 may be configured as or otherwise support a means for comparing the voltage of the power supply line with the threshold, where the determination that the voltage of the power supply line is below the threshold is based at least in part on the comparison.

The receive circuitry 535 may be configured as or otherwise support a means for receiving, by a controller coupled with a power supply line and a set of memory devices, a set of one or more messages each indicating a respective amount of consumption of current for each memory device of the set of memory devices. In some examples, the power control logic 530 may be configured as or otherwise support a means for determining, based at least in part on the set of one or more messages, a correlation between a collective amount of consumption of current by the set of memory devices and a corresponding decrease in a voltage on the power supply line. In some examples, the power control logic 530 may be configured as or otherwise support a means for updating an upper limit for consumption of current by the set of memory devices based at least in part on the correlation.

In some examples, the power control logic 530 may be configured as or otherwise support a means for determining the collective amount of consumption of current based at least in part on the respective amount of consumption of current for each memory device.

In some examples, the power control logic 530 may be configured as or otherwise support a means for combining the respective amounts of consumption of current for the memory devices, where the collective amount of consumption of current is based at least in part on combining the respective amounts.

In some examples, the power control logic 530 may be configured as or otherwise support a means for determining a magnitude of the corresponding decrease in the voltage on the power supply line, where the correlation is determined based at least in part on the magnitude of the corresponding decrease in the voltage.

In some examples, to support updating the upper limit, the power control logic 530 may be configured as or otherwise support a means for decreasing the upper limit from a first value to a second value. In some examples, to support updating the upper limit, the transmit circuitry 540 may be configured as or otherwise support a means for indicating the second value to the set of memory devices.

In some examples, the voltage detection circuitry 525 may be configured as or otherwise support a means for sampling the voltage on the power supply line, where the corresponding decrease in the voltage is based at least in part on sampling the voltage.

In some examples, the power control logic 530 may be configured as or otherwise support a means for determining whether a second collective amount of consumption of current by the set of memory devices satisfies a threshold, where the voltage on the power supply line is sampled based at least in part on determining that the second collective amount of consumption of current satisfies the threshold.

In some examples, the threshold is below the upper limit for consumption of current by the set of memory devices. In some examples, each of the set of one or more messages indicates a respective quantity of tokens each associated with an amount of current. In some examples, each of the set of one or more messages is associated with a duration and the collective amount of consumption of current is for the duration.

Figure 6:
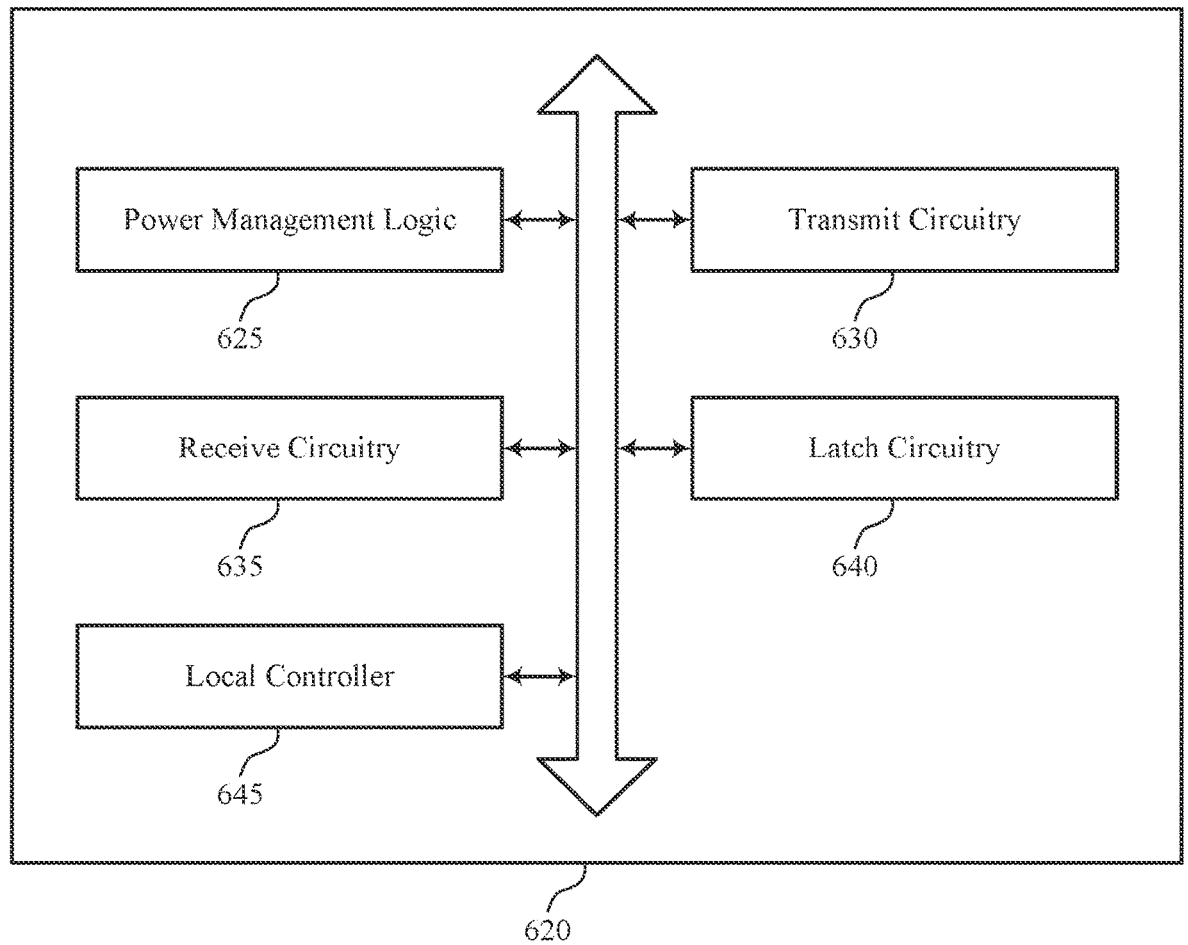
FIG. 6 shows a block diagram of a memory device that supports current budget adaption in accordance with examples as disclosed herein.

FIG. 6 shows a block diagram 600 of a memory device 620 that supports current budget adaption in accordance with examples as disclosed herein. The memory device 620 may be an example of aspects of a memory device as described with reference to FIGS. 1 through 4. The memory device 620, or various components thereof, may be an example of means for performing various aspects of current budget adaption as described herein. For example, the memory device 620 may include a power management logic 625, a transmit circuitry 630, a receive circuitry 635, a latch circuitry 640, a local controller 645, or any combination thereof. Each of these components may communicate, directly or indirectly, with one another (e.g., via one or more buses).

The power management logic 625 may be configured as or otherwise support a means for determining, by a memory device coupled with a power supply line, a respective amount of current consumption associated with the memory device. The transmit circuitry 630 may be configured as or otherwise support a means for communicating an indication of the respective amount of current consumption to a controller coupled with the memory device. The receive circuitry 635 may be configured as or otherwise support a means for receiving, based at least in part on communicating the indication, a control signal indicating an updated upper limit for a consumption of current for the memory device.

In some examples, the receive circuitry 635 may be configured as or otherwise support a means for receiving a command that instructs the memory device to store the indication of the respective amount of current consumption. In some examples, the latch circuitry 640 may be configured as or otherwise support a means for storing the indication of the respective amount of current consumption based at least in part on the command.

In some examples, the command instructs the memory device to suspend one or more operations at the memory device, and the local controller 645 may be configured as or otherwise support a means for suspending the one or more operations based at least in part on the command.

In some examples, the receive circuitry 635 may be configured as or otherwise support a means for receiving, after storing the indication of the respective amount of current consumption, a request for current consumption information for the memory device, where the indication of the respective amount of current consumption is communicated based at least in part on the request.

In some examples, to support communicating the indication of the respective amount of current consumption, the transmit circuitry 630 may be configured as or otherwise support a means for communicating a message indicating a quantity of tokens each associated with an amount of current.

In some examples, the transmit circuitry 630 may be configured as or otherwise support a means for communicating the message to a set of one or more memory devices coupled with the memory device.

In some examples, the local controller 645 may be configured as or otherwise support a means for storing the updated upper limit at the memory device. In some examples, the power management logic 625 may be configured as or otherwise support a means for managing current consumption by the memory device based at least in part on the updated upper limit.

Figure 7:
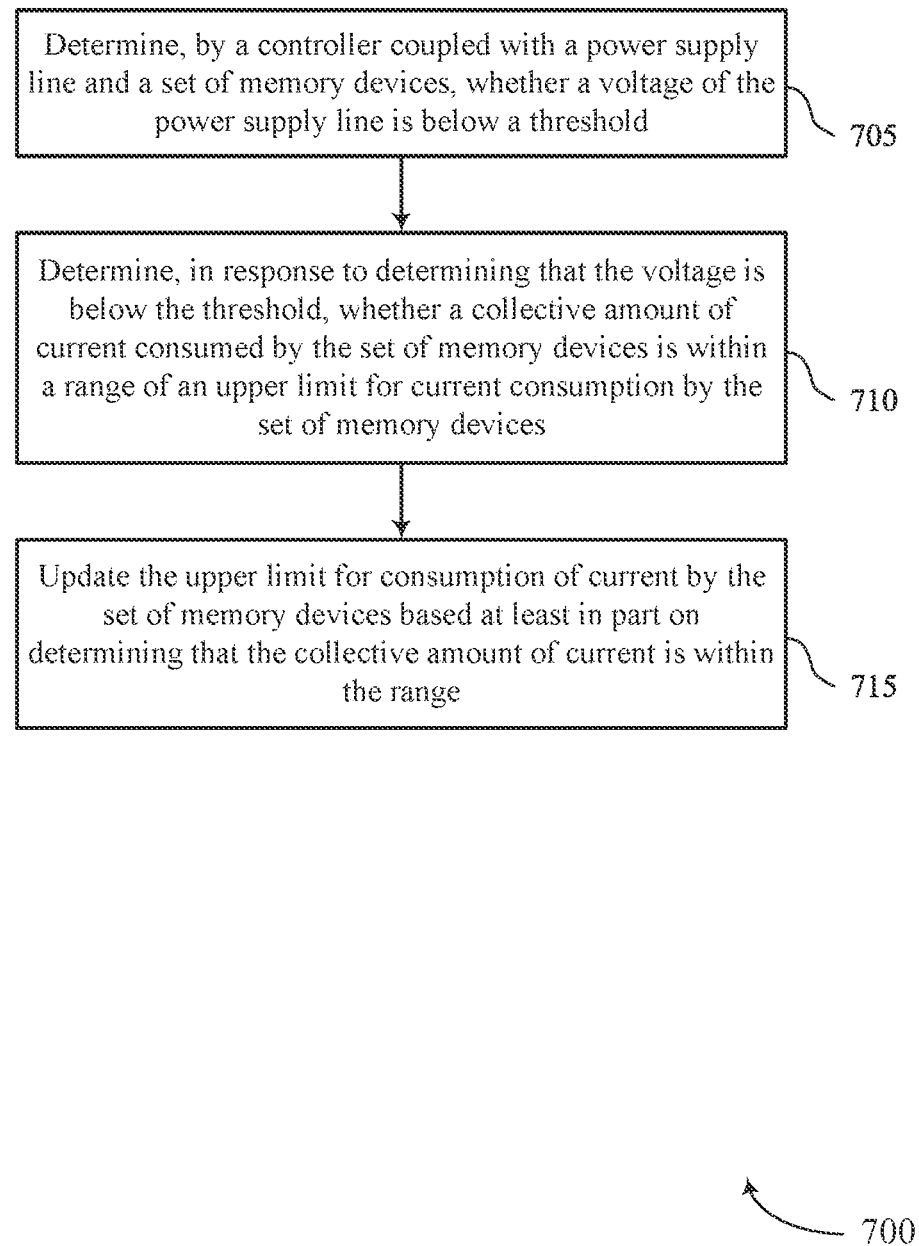
FIGS. 7 through 9 show flowcharts illustrating a method or methods that support current budget adaption in accordance with examples as disclosed herein.

FIG. 7 shows a flowchart illustrating a method 700 that supports current budget adaption in accordance with examples as disclosed herein. The operations of method 700 may be implemented by a controller or its components as described herein. For example, the operations of method 700 may be performed by a controller as described with reference to FIGS. 1 through 5. In some examples, a controller may execute a set of instructions to control the functional elements of the device to perform the described functions. Additionally or alternatively, the controller may perform aspects of the described functions using special-purpose hardware.

At 705, the method may include determining, by a controller coupled with a power supply line and a set of memory devices, whether a voltage of the power supply line is below a threshold. The operations of 705 may be performed in accordance with examples as disclosed herein. In some examples, aspects of the operations of 705 may be performed by a voltage detection circuitry 525 as described with reference to FIG. 5.

At 710, the method may include determining, in response to determining that the voltage is below the threshold, whether a collective amount of current consumed by the set of memory devices is within a range of an upper limit for current consumption by the set of memory devices. The operations of 710 may be performed in accordance with examples as disclosed herein. In some examples, aspects of the operations of 710 may be performed by a power control logic 530 as described with reference to FIG. 5.

At 715, the method may include updating the upper limit for consumption of current by the set of memory devices based at least in part on determining that the collective amount of current is within the range. The operations of 715 may be performed in accordance with examples as disclosed herein. In some examples, aspects of the operations of 715 may be performed by a power control logic 530 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for determining, by a controller coupled with a power supply line and a set of memory devices, whether a voltage of the power supply line is below a threshold, determining, in response to determining that the voltage is below the threshold, whether a collective amount of current consumed by the set of memory devices is within a range of an upper limit for current consumption by the set of memory devices, and updating the upper limit for consumption of current by the set of memory devices based at least in part on determining that the collective amount of current is within the range. The upper limit may refer to a target upper limit and thus may be inadvertently exceeded by the set of memory devices. The upper limit for consumption of current may also be referred to as the power budget, the total current budget, the peak current budget, or other suitable terminology.

Some examples of the method 700 and the apparatus described herein may further include operations, features, circuitry, logic, means, or instructions for requesting information about a respective amount of current consumed by each memory device of the set of memory devices and receiving the information about the respective amount of current consumed by each memory device based at least in part on the request, where the collective amount of current consumed by the set of memory devices may be determined based at least in part on the respective amount of current consumed by each memory device.

Some examples of the method 700 and the apparatus described herein may further include operations, features, circuitry, logic, means, or instructions for determining whether the voltage of the power supply line may be above the threshold, where requesting the information may be based at least in part on determining that the voltage of the power supply line may be above the threshold.

Some examples of the method 700 and the apparatus described herein may further include operations, features, circuitry, logic, means, or instructions for requesting, based at least in part on determining that the voltage of the power supply line may have decreased below the threshold, each memory device of the set of memory devices to store respective current consumption information and suspend one or more operations.

In some examples of the method 700 and the apparatus described herein, updating the upper limit may include operations, features, circuitry, logic, means, or instructions for decreasing the upper limit from a first value to a second value and indicating the second value to the set of memory devices.

Some examples of the method 700 and the apparatus described herein may further include operations, features, circuitry, logic, means, or instructions for comparing the voltage of the power supply line with the threshold, where the determination that the voltage of the power supply line may be below the threshold may be based at least in part on the comparison.

Figure 8:
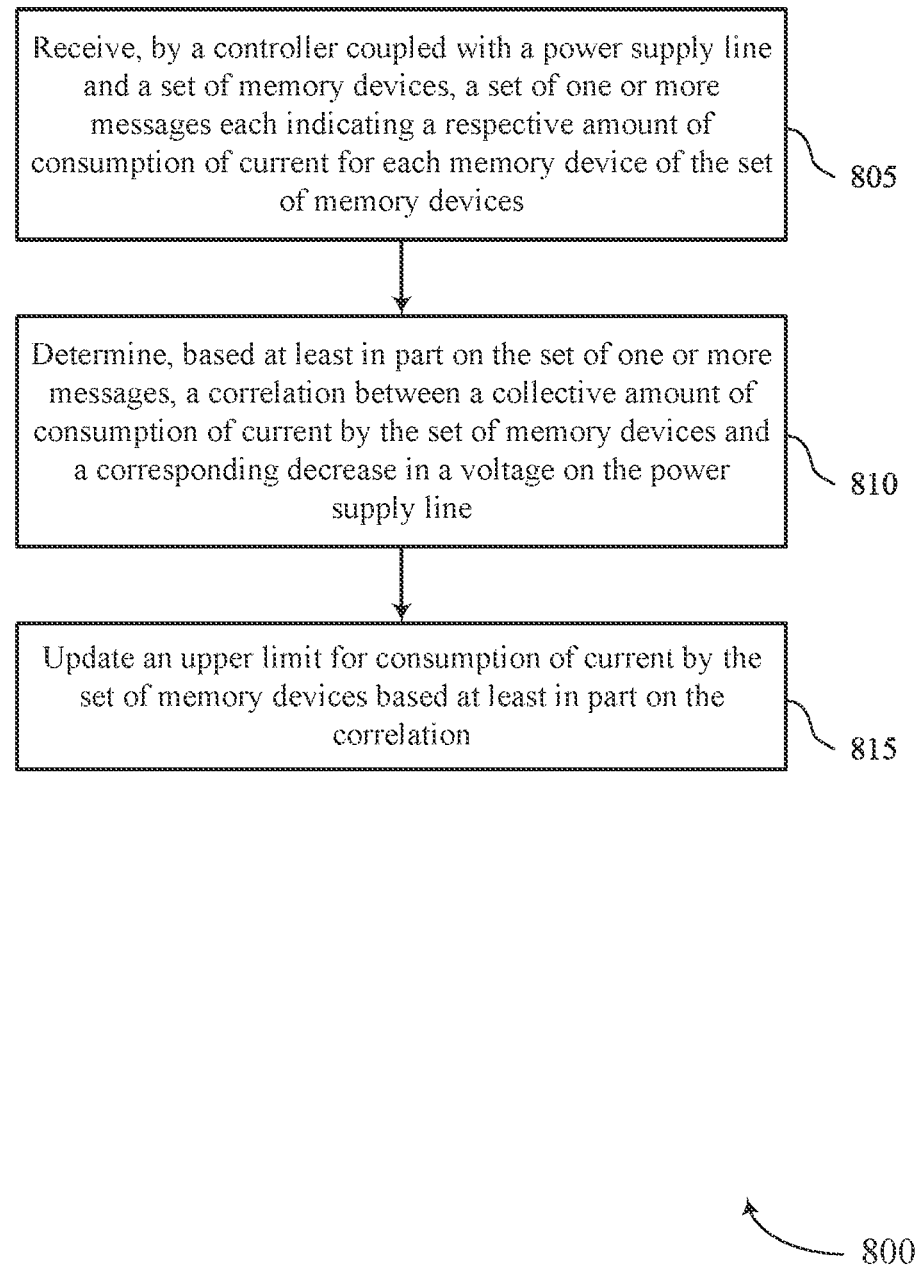

FIG. 8 shows a flowchart illustrating a method 800 that supports current budget adaption in accordance with examples as disclosed herein. The operations of method 800 may be implemented by a controller or its components as described herein. For example, the operations of method 800 may be performed by a controller as described with reference to FIGS. 1 through 5. In some examples, a controller may execute a set of instructions to control the functional elements of the device to perform the described functions. Additionally or alternatively, the controller may perform aspects of the described functions using special-purpose hardware.

At 805, the method may include receiving, by a controller coupled with a power supply line and a set of memory devices, a set of one or more messages each indicating a respective amount of consumption of current for each memory device of the set of memory devices. The operations of 805 may be performed in accordance with examples as disclosed herein. In some examples, aspects of the operations of 805 may be performed by a receive circuitry 535 as described with reference to FIG. 5.

At 810, the method may include determining, based at least in part on the set of one or more messages, a correlation between a collective amount of consumption of current by the set of memory devices and a corresponding decrease in a voltage on the power supply line. The operations of 810 may be performed in accordance with examples as disclosed herein. In some examples, aspects of the operations of 810 may be performed by a power control logic 530 as described with reference to FIG. 5.

At 815, the method may include updating an upper limit for consumption of current by the set of memory devices based at least in part on the correlation. The operations of 815 may be performed in accordance with examples as disclosed herein. In some examples, aspects of the operations of 815 may be performed by a power control logic 530 as described with reference to FIG. 5.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving, by a controller coupled with a power supply line and a set of memory devices, a set of one or more messages each indicating a respective amount of consumption of current for each memory device of the set of memory devices, determining, based at least in part on the set of one or more messages, a correlation between a collective amount of consumption of current by the set of memory devices and a corresponding decrease in a voltage on the power supply line, and updating an upper limit for consumption of current by the set of memory devices based at least in part on the correlation.

Some examples of the method 800 and the apparatus described herein may further include operations, features, circuitry, logic, means, or instructions for determining the collective amount of consumption of current based at least in part on the respective amount of consumption of current for each memory device.

Some examples of the method 800 and the apparatus described herein may further include operations, features, circuitry, logic, means, or instructions for combining the respective amounts of consumption of current for the memory devices, where the collective amount of consumption of current may be based at least in part on combining the respective amounts.

Some examples of the method 800 and the apparatus described herein may further include operations, features, circuitry, logic, means, or instructions for determining a magnitude of the corresponding decrease in the voltage on the power supply line, where the correlation may be determined based at least in part on the magnitude of the corresponding decrease in the voltage.

In some examples of the method 800 and the apparatus described herein, updating the upper limit may include operations, features, circuitry, logic, means, or instructions for decreasing the upper limit from a first value to a second value and indicating the second value to the set of memory devices.

Some examples of the method 800 and the apparatus described herein may further include operations, features, circuitry, logic, means, or instructions for sampling the voltage on the power supply line, where the corresponding decrease in the voltage may be based at least in part on sampling the voltage.

Some examples of the method 800 and the apparatus described herein may further include operations, features, circuitry, logic, means, or instructions for determining whether a second collective amount of consumption of current by the set of memory devices satisfies a threshold, where the voltage on the power supply line may be sampled based at least in part on determining that the second collective amount of consumption of current satisfies the threshold.

In some examples of the method 800 and the apparatus described herein, the threshold may be below the upper limit for consumption of current by the set of memory devices. In some examples of the method 800 and the apparatus described herein, each of the set of one or more messages indicates a respective quantity of tokens each associated with an amount of current. In some examples of the method 800 and the apparatus described herein, each of the set of one or more messages may be associated with a duration and the collective amount of consumption of current may be for the duration.

Figure 9:
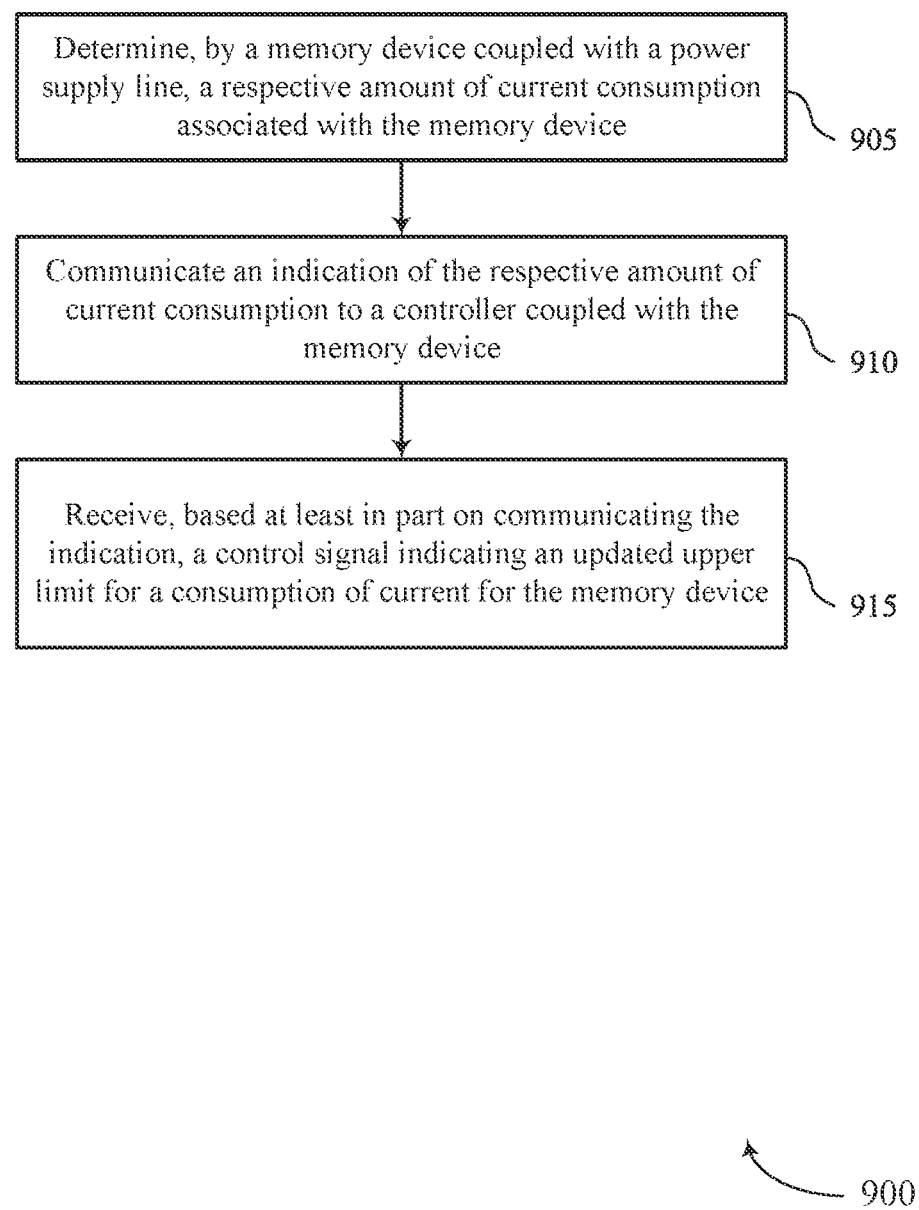

FIG. 9 shows a flowchart illustrating a method 900 that supports current budget adaption in accordance with examples as disclosed herein. The operations of method 900 may be implemented by a memory device or its components as described herein. For example, the operations of method 900 may be performed by a memory device as described with reference to FIGS. 1 through 4 and 6. In some examples, a memory device may execute a set of instructions to control the functional elements of the device to perform the described functions. Additionally or alternatively, the memory device may perform aspects of the described functions using special-purpose hardware.

At 905, the method may include determining, by a memory device coupled with a power supply line, a respective amount of current consumption associated with the memory device. The operations of 905 may be performed in accordance with examples as disclosed herein. In some examples, aspects of the operations of 905 may be performed by a power management logic 625 as described with reference to FIG. 6.

At 910, the method may include communicating an indication of the respective amount of current consumption to a controller coupled with the memory device. The operations of 910 may be performed in accordance with examples as disclosed herein. In some examples, aspects of the operations of 910 may be performed by a transmit circuitry 630 as described with reference to FIG. 6.

At 915, the method may include receiving, based at least in part on communicating the indication, a control signal indicating an updated upper limit for a consumption of current for the memory device. The operations of 915 may be performed in accordance with examples as disclosed herein. In some examples, aspects of the operations of 915 may be performed by a receive circuitry 635 as described with reference to FIG. 6.

In some examples, an apparatus as described herein may perform a method or methods, such as the method 900. The apparatus may include, features, circuitry, logic, means, or instructions (e.g., a non-transitory computer-readable medium storing instructions executable by a processor) for determining, by a memory device coupled with a power supply line, a respective amount of current consumption associated with the memory device, communicating an indication of the respective amount of current consumption to a controller coupled with the memory device, and receiving, based at least in part on communicating the indication, a control signal indicating an updated upper limit for a consumption of current for the memory device.

Some examples of the method 900 and the apparatus described herein may further include operations, features, circuitry, logic, means, or instructions for receiving a command that instructs the memory device to store the indication of the respective amount of current consumption and storing the indication of the respective amount of current consumption based at least in part on the command.

In some examples of the method 900 and the apparatus described herein, the command instructs the memory device to suspend one or more operations at the memory device and the method, apparatuses, and non-transitory computer-readable medium may include further operations, features, circuitry, logic, means, or instructions for suspending the one or more operations based at least in part on the command.

Some examples of the method 900 and the apparatus described herein may further include operations, features, circuitry, logic, means, or instructions for receiving, after storing the indication of the respective amount of current consumption, a request for current consumption information for the memory device, where the indication of the respective amount of current consumption may be communicated based at least in part on the request.

In some examples of the method 900 and the apparatus described herein, communicating the indication of the respective amount of current consumption may include operations, features, circuitry, logic, means, or instructions for communicating a message indicating a quantity of tokens each associated with an amount of current.

Some examples of the method 900 and the apparatus described herein may further include operations, features, circuitry, logic, means, or instructions for communicating the message to a set of one or more memory devices coupled with the memory device.

Some examples of the method 900 and the apparatus described herein may further include operations, features, circuitry, logic, means, or instructions for storing the updated upper limit at the memory device and managing current consumption by the memory device based at least in part on the updated upper limit.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a power supply line coupled with a set of memory devices; and
   a controller coupled with the set of memory devices and the power supply line, the controller configured to cause the apparatus to:
   determine whether a voltage of the power supply line is below a threshold;
   determine, in response to determining that the voltage is below the threshold, whether a collective amount of current consumed by the set of memory devices is within a range of an upper limit for current consumption by the set of memory devices; and
   update the upper limit for consumption of current by the set of memory devices based at least in part on determining that the collective amount of current is within the range.

2. The apparatus of claim 1, wherein the controller is further configured to cause the apparatus to:
   request information about a respective amount of current consumed by each memory device of the set of memory devices; and
   receive the information about the respective amount of current consumed by each memory device based at least in part on the requesting, wherein the collective amount of current consumed by the set of memory devices is determined based at least in part on the respective amount of current consumed by each memory device.

3. The apparatus of claim 2, wherein the controller is further configured to cause the apparatus to:
   determine whether the voltage of the power supply line is above the threshold, wherein requesting the information is based at least in part on determining that the voltage of the power supply line is above the threshold.

4. The apparatus of claim 1, wherein the controller is further configured to cause the apparatus to:
   request, based at least in part on determining that the voltage of the power supply line has decreased below the threshold, each memory device of the set of memory devices to store respective current consumption information and suspend one or more operations.

5. The apparatus of claim 1, wherein updating the upper limit further comprises the controller configured to cause the apparatus to:
   decrease the upper limit from a first value to a second value; and
   indicate the second value to the set of memory devices.

6. The apparatus of claim 1, wherein the controller is further configured to cause the apparatus to:

compare the voltage of the power supply line with the threshold, wherein the determination that the voltage of the power supply line is below the threshold is based at least in part on the comparison.

7. An apparatus, comprising:
a power supply line coupled with a set of memory devices; and
a controller coupled with the set of memory devices and the power supply line, the controller configured to cause the apparatus to:
receive a set of one or more messages each indicating a respective amount of consumption of current for each memory device of the set of memory devices;
determine, based at least in part on the set of one or more messages, a correlation between a collective amount of consumption of current by the set of memory devices and a corresponding decrease in a voltage on the power supply line; and
update an upper limit for consumption of current by the set of memory devices based at least in part on the correlation.

8. The apparatus of claim 7, wherein the controller is further configured to cause the apparatus to:
determine the collective amount of consumption of current based at least in part on the respective amount of consumption of current for each memory device.

9. The apparatus of claim 8, wherein the controller is further configured to cause the apparatus to:
combine the respective amounts of consumption of current for the memory devices, wherein the collective amount of consumption of current is based at least in part on combining the respective amounts.

10. The apparatus of claim 7, wherein the controller is further configured to cause the apparatus to:
determine a magnitude of the corresponding decrease in the voltage on the power supply line, wherein the correlation is determined based at least in part on the magnitude of the corresponding decrease in the voltage.

11. The apparatus of claim 7, wherein updating the upper limit further comprises the controller configured to cause the apparatus to:
decrease the upper limit from a first value to a second value; and
indicate the second value to the set of memory devices.

12. The apparatus of claim 7, wherein the controller is further configured to cause the apparatus to:
sample the voltage on the power supply line, wherein the corresponding decrease in the voltage is based at least in part on sampling the voltage.

13. The apparatus of claim 12, wherein the controller is further configured to cause the apparatus to:
determine whether a second collective amount of consumption of current by the set of memory devices satisfies a threshold, wherein the voltage on the power supply line is sampled based at least in part on determining that the second collective amount of consumption of current satisfies the threshold.

14. The apparatus of claim 13, wherein the threshold is below the upper limit for consumption of current by the set of memory devices.

15. The apparatus of claim 7, wherein each of the set of one or more messages indicates a respective quantity of tokens each associated with an amount of current.

16. The apparatus of claim 7, wherein each of the set of one or more messages is associated with a duration and the collective amount of consumption of current is for the duration.

17. An apparatus, comprising:
a memory device;
a power supply line coupled with the memory device; and
a local controller coupled with the memory device and configured to cause the apparatus to:
determine a respective amount of current consumption associated with the memory device;
communicate an indication of the respective amount of current consumption to a controller coupled with the memory device; and
receive, based at least in part on communicating the indication, a control signal indicating an updated upper limit for a consumption of current for the memory device.

18. The apparatus of claim 17, wherein the local controller is further configured to cause the apparatus to:
receive a command that instructs the memory device to store the indication of the respective amount of current consumption; and
store the indication of the respective amount of current consumption based at least in part on the command.

19. The apparatus of claim 18, wherein the command instructs the memory device to suspend one or more operations at the memory device, and wherein the local controller is further configured to cause the apparatus to:
suspend the one or more operations based at least in part on the command.

20. The apparatus of claim 18, wherein the local controller is further configured to cause the apparatus to:
receive, after storing the indication of the respective amount of current consumption, a request for current consumption information for the memory device, wherein the indication of the respective amount of current consumption is communicated based at least in part on the request.

21. The apparatus of claim 17, wherein communicating the indication of the respective amount of current consumption further comprises the local controller configured to cause the apparatus to:
communicate a message indicating a quantity of tokens each associated with an amount of current.

22. The apparatus of claim 21, wherein the local controller is further configured to cause the apparatus to:
communicate the message to a set of one or more memory devices coupled with the memory device.

23. The apparatus of claim 17, wherein the local controller is further configured to cause the apparatus to:
store the updated upper limit at the memory device; and
manage current consumption by the memory device based at least in part on the updated upper limit.

* * * * *